United States Patent
Wu et al.

(10) Patent No.: US 8,732,628 B1
(45) Date of Patent: May 20, 2014

(54) METHOD AND SYSTEM FOR PHOTOMASK ASSIGNMENT FOR DOUBLE PATTERNING TECHNOLOGY

(71) Applicant: Taiwan Semiconductor Manufacturing Co., Ltd., Hsin-Chu (TW)

(72) Inventors: Meng-Fan Wu, Keelung (TW); I-Fan Lin, Hsinchu (TW); Ke-Ying Su, Taipei (TW); Hsiao-Shu Chao, Baoshan Township (TW); Yi-Kan Cheng, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/742,689

(22) Filed: Jan. 16, 2013

(51) Int. Cl.
*G06F 17/50* (2006.01)

(52) U.S. Cl.
USPC ............... 716/52; 716/50; 716/51; 716/53; 716/54; 716/55; 430/5; 430/30

(58) Field of Classification Search
USPC .................... 716/50–56; 430/5, 30
See application file for complete search history.

(56) References Cited

U.S. PATENT DOCUMENTS 8,119,310 B1    2/2012   Lu et al.
2006/0277515 A1*  12/2006   Curtin et al. ............. 716/10

OTHER PUBLICATIONS

"A New Graph-Theoretic, Multi-Objective Layout Decomposition Framework for Double Patterning Lithography", by Jae-Seok Yang, Katrina Lu, Minsik Cho, Kun Yuan, and David Z. Pan, IEEE @2010.*
"Overlay Aware Interconnect and Timing Variation Modeling for Double Patterning Technology", by Jae-Seok Yang, David Z. Pan, IEEE @2008.*

* cited by examiner

*Primary Examiner* — Nha Nguyen
(74) *Attorney, Agent, or Firm* — Duane Morris LLP; Steven E. Koffs (57) ABSTRACT

A method comprises: selecting a circuit pattern or network of circuit patterns in a layout of an integrated circuit (IC) to be fabricating using double patterning technology (DPT). Circuit patterns near the selected circuit pattern or network are grouped into one or more groups. For each group, a respective expected resistance-capacitance (RC) extraction error cost is calculated, which is associated with a mask alignment error, for two different sets of mask assignments. The circuit patterns in the one or more groups are assigned to be patterned by respective photomasks, so as to minimize a total of the expected RC extraction error costs.

20 Claims, 7 Drawing Sheets

|  | LEFT GROUPS | | RIGHT GROUPS | |
|---|---|---|---|---|
|  | w | b | w | b |
| CC#1 | 60 | 0 | -- | -- |
| CC#2 | 0 | 20 | -- | -- |
| CC#3 | -- | -- | 40 | 35 |

METHOD AND SYSTEM FOR PHOTOMASK ASSIGNMENT FOR DOUBLE PATTERNING TECHNOLOGY

FIELD

This disclosure relates to semiconductor fabrication generally, and more specifically to tools for preparing integrated circuit designs for photomask generation.

BACKGROUND

In semiconductor fabrication processes, the resolution of a photoresist pattern begins to blur at about 45 nanometer (nm) half pitch. To continue to use fabrication equipment purchased for larger technology nodes, multi-exposure methods have been developed.

Multiple exposure or multi-patterning technology (MPT) involves forming patterns on a single layer of a substrate using two or more different masks in succession. If only two masks are used for patterning a layer, the technique is referred to as double exposure. One form of double exposure is referred to as double patterning technology (DPT). In DPT, first and second masks are used sequentially to pattern the same layer. As long as the patterns within each mask comply with the relevant minimum separation distances for the technology node, the combination of patterns formed using both masks may include smaller spacings than the minimum separation distance.

DPT is a layout splitting method analogous to a two-color problem for layout splitting in graph theory. For example, if two masks are to be used (double patterning, DPT), it is customary to refer to the patterns as being assigned one of two "color types", where the color corresponds to a photomask assignment.

If there is any mask alignment error, the patterns formed by the second photomask are shifted relative to the patterns formed by the first photomask. A pattern formed by the second photomask can be closer to, or further from, a given pattern formed by the first photomask, causing the parasitic resistance-capacitance (RC) coupling between the patterns to differ from the couplings computed by RC extraction, which are used for timing analysis.

DETAILED DESCRIPTION

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Embodiments described herein provide a tool and methodology of coloring optimization for RC corners. The method and tool balance the coloring (mask assignments) of various patterns or groups of patterns to reduce the total variations in RC couplings from the couplings used during timing analysis. This technique can be applied to timing critical nets, for example, to reduce coupling variations caused by mask alignment. The resulting mask decomposition is subject to less shift impact due to RC corners (i.e., if the maximum expected mask misalignment occurs), and thus improves timing margin for the design.

As used herein, the term "polygons" refers to circuit patterns in the shape of polygons within an integrated circuit. These circuit patterns can be conductive patterns in the conductive line (interconnect) layers, or diffusion patterns in the active device layers, for example. The term "coloring" refers to assigning a circuit pattern to a particular mask for patterning a layer of an IC by MPT.

Figure 1:
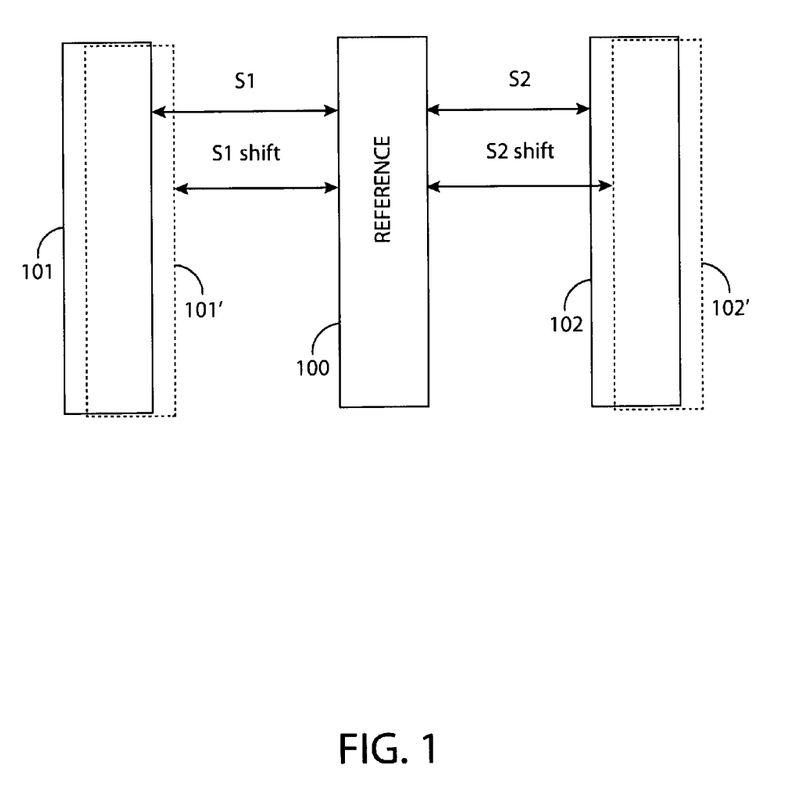
FIG. 1 is a diagram of circuit patterns with and without mask misalignment.

FIG. 1 shows a region of an IC containing three circuit patterns 100, 101 and 102 to be formed by DPT. The patterns are separated by spacings S1 and S2, which are smaller than the minimum spacing for clearly patterning adjacent lines using a single photomask and single etch (1P1E), referred to below as the "minimum 1P1E spacing." Pattern 100 is designated as the "target" pattern. If pattern 100 is assigned to a first photomask, then both patterns 101 and 102 are assigned to a second photomask to ensure clear patterning. If there is a misalignment between the second photomask and the patterns formed by the first photomask, then both of the patterns 101, 102 are shifted in the same direction relative to pattern 100.

For example, if the second mask is shifted to the right, then patterns 101 and 102 are both shifted right, as shown by 101' and 102', and the spacings S1 and S2 are changed to S1shift and S2shift, respectively. Because all patterns formed by the second mask shift in the same direction, patterns (e.g., 101) to the left of target pattern 100 are shifted towards pattern 100, and patterns (e.g., 102) to the right of target pattern 100 are shifted away from pattern 100. The parasitic couplings between adjacent patterns varies with the spacing. Assuming that the RC extraction results are based on spacings S1 and S2, the actual parasitic coupling between pattern 100 and 101' is greater than the computed coupling between patterns 100 and 101 provided by RC extraction. On the other hand, the actual parasitic coupling between pattern 100 and 102' is less than the computed coupling between patterns 100 and 102 provided by RC extraction. In general the variations in parasitic couplings relative to the RC extraction output parasitic couplings are positive on one side of the target pattern and negative on the other side of the target pattern.

The inventors have determined that misalignment-induced deviations between the parasitic capacitances computed by RC extraction (and used in timing analysis) and the actual parasitic capacitances are reduced if nearby patterns on one side of a given target pattern are balanced against the patterns on the other side of the target pattern. When the patterns are balanced in this manner, for any given parasitic coupling increase, there is approximately an opposite compensating decrease in parasitic coupling on the opposite side of the target pattern. By reducing the deviation between actual parasitic capacitance and the values computed by RC extraction during the design process, deviations between the design timing analysis and actual IC timing performance are also reduced. Thus, the designer can reduce the timing margin of the design.

Figure 2:
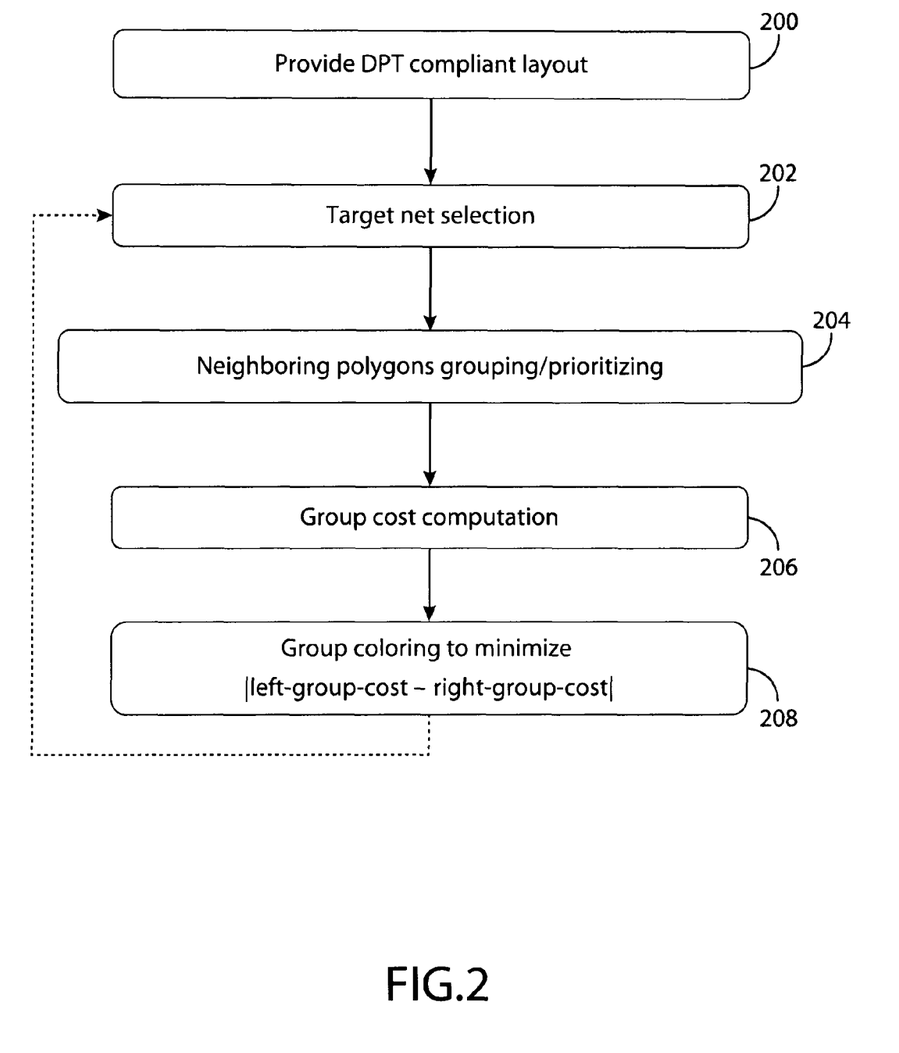
FIG. 2 is a flow chart of a method for assigning circuit patterns to photomasks for DPT.

FIG. 2 is a flow chart showing one embodiment of a method.

At step 200, a DPT compliant layout for a layer of an IC is provided. The layout is capable of being decomposed into two sets of patterns for patterning by a two-photomask, two-etch (2P2E) process, without any stiches. The layer can be a back end of line (BEOL) layer, such as a conductive line layer, or a front end of line (FEOL) layer, such as a diffusion layer. At this stage, the designer may have pre-colored one or more subsets of the patterns, to be assigned to masks selected by the user. For example, a small design block can be fully colored by the user (including two colors, or photomasks, for patterning the same layer of the IC) for timing optimization before it is used in a full design. For example, a timing critical network, such as a clock network, can be pre-grouped, so that all of the clock lines in the layer of the layout assigned to the same photomask.

Commercial design rule checking (DRC) tools together with DRC technology file inputs by the designer or foundry are used to form a DPT compliant, two-colorable layout. In some embodiments, the original layout and DRC-clean layout has partially pre-colored information. That is, the designer has identified the mask assignments (colors) for at least one network of patterns that should be formed on the masks designated by the user. By partial pre-coloring, the designer can ensure that a timing critical network of patterns are formed using designer-selected photomask assignments, for timing optimization.

At step 202, a target circuit pattern or network of circuit patterns is selected from a layout of an integrated circuit (IC) to be fabricating using double patterning technology (DPT). In some embodiments, the patterns and/or networks within a layer are prioritized in order of timing criticality, and the highest priority pattern or network is selected as the target.

Figure 3:
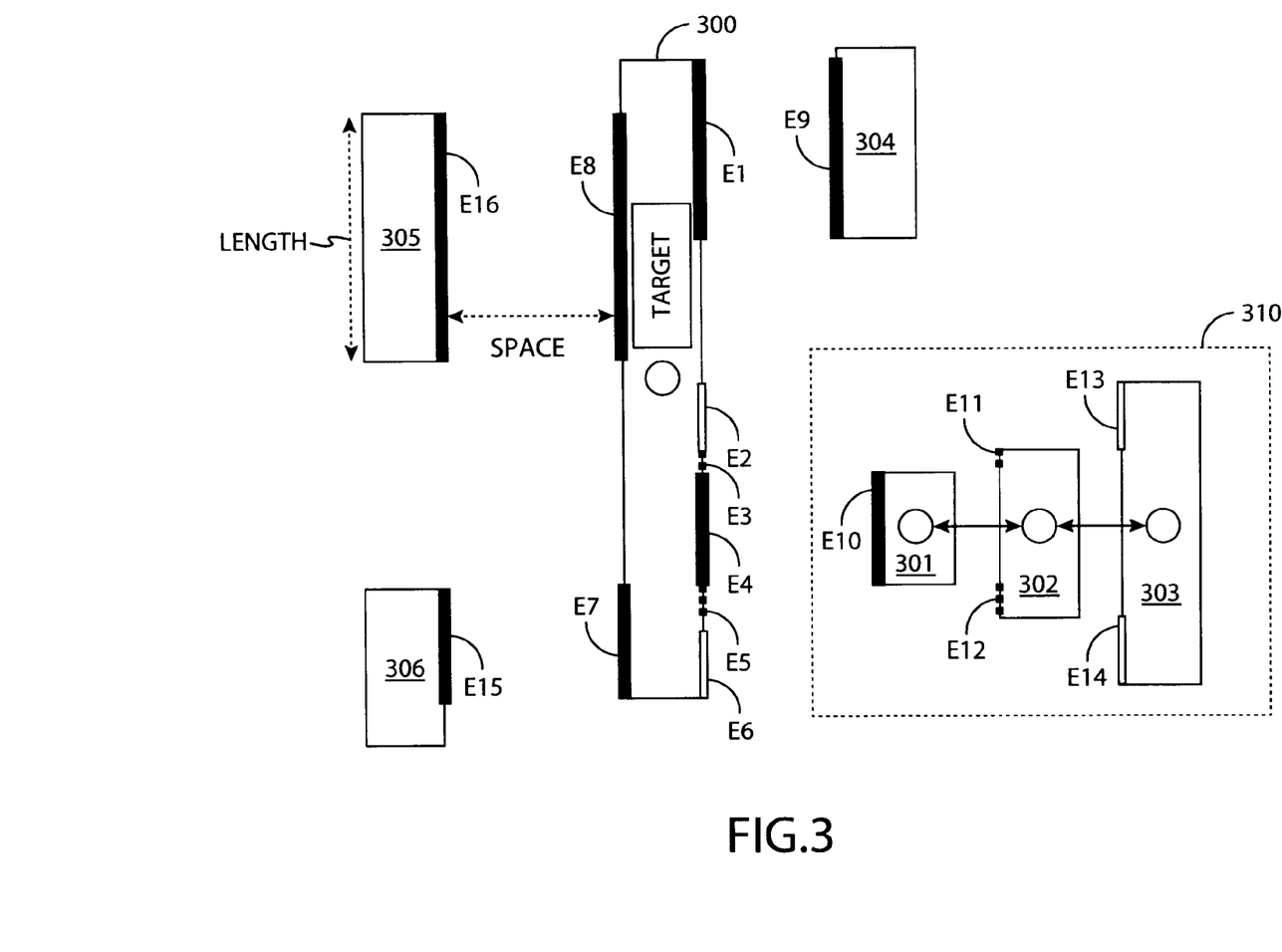
FIGS. 3-5 are diagrams showing pertinent features for calculating the cost of mask misalignment.
Figure 4:
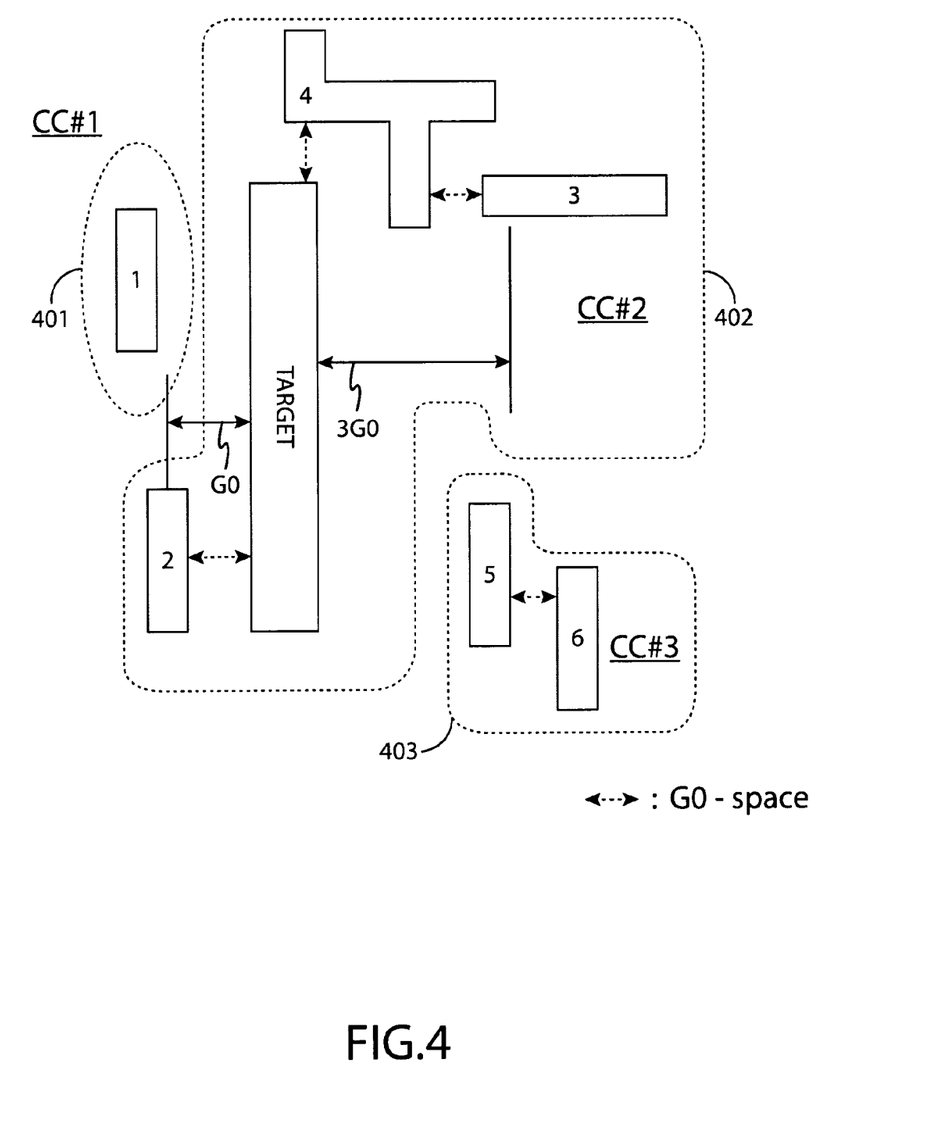

At step 204, circuit patterns near the selected circuit pattern or network are grouped into one or more groups. Adjacent patterns within each group of circuit patterns are separated by less than a predetermined distance (the minimum 1P1E spacing). FIGS. 3 and 4 show two examples of the grouping.

In FIG. 3, the pattern 300 is selected as the target pattern. Patterns 301-303 are connected by double arrows indicating that the spacings between patterns 301 and 302, and between 302 and 303 are both smaller than the minimum 1P1E spacing. Thus, patterns 301-303 are grouped into a single group 310. Also, the remaining patterns 300, 304, 305 and 306 are all separated from each other by at least the minimum 1P1E spacing. Thus, each of the patterns 304-306 can be treated as a separate group. Within the group 310, the patterns 301-303 can be assigned to masks independently of the target pattern 300. Patterns 301 and 303 are assigned to the same mask as each other, and pattern 302 is assigned to the other mask.

FIG. 4 represents a slightly more complex configuration. As shown in FIG. 4, there are sub-minimum 1P1E spacings between the target pattern and each of patterns 2 and 4. There are additional sub-minimum 1P1E spacings between pattern 4 and pattern 3, and between patterns 5 and 6. In this situation, the mask assignments of patterns 2, 3 and 4 are determined by the mask assignment of the target; pattern 3 is assigned to the same mask as the target pattern, and patterns 2 and 4 are assigned to a different mask from the target pattern. Thus, patterns 1-4 are included in the target network, pattern 1 is a single-pattern group, and patterns 5 and 6 are assigned to another group.

Because the method of FIG. 2 is an iterative flow, and each iteration of steps 202-208 is based on the previous mask assignments (coloring solution) without overriding those assignments, network priority and selection sequence is significant. Different network selection and processing orders will result in different coloring (mask assignment) results.

Thus, the groups can be ordered by timing criticality, in which case the computation and assigning steps are performed for each group (or the most timing-critical subset of the groups) in order of the respective timing criticality of each group. In some embodiments, the loop is reiterated, successively selecting each timing critical network as target, and leaving the rest of the circuit patterns (greater than a threshold distance from any of the selected target networks) uncolored, to be assigned later using the same method, or a different assignment criterion.

At step 206, for each group, a respective expected resistance-capacitance (RC) extraction error cost associated with a mask alignment error is calculated, for two different sets of mask assignments. An example is explained with reference to FIG. 3.

Referring again to FIG. 3, there are parasitic couplings between the target pattern 300 and each of the patterns 301-306. During RC extraction, these parasitic couplings are computed based on the assumption of perfect alignment between the patterns formed by the first mask and the second mask. Step 206 determines the "cost" in terms of increased parasitic coupling as a result of any misalignment between patterns formed by the first mask and the second mask. The cost depends on the amount of misalignment. In some embodiments, for rapid speed of computation, the cost is computed using the misalignment corner value.

For example, in some embodiments, the maximum misalignment (corner value) is assumed to be about 0.1 times the minimum 1P1E spacing. For example, at a technology node for which the minimum 1P1E spacing is 32 nm, the maximum misalignment is assumed to be 3.3 nm. If the distance between patterns becomes large, the compensation becomes negligible because the mask shift amount compared to polygon's distance is relatively small. Thus, it is reasonable to only consider nearby polygons within a threshold distance when using the method of FIG. 2. FIG. 4 shows the minimum 1P1E spacing, designated "G0" and a distance which is 3 times the minimum 1P1E spacing, designated "3G0". Thus, the spacings smaller than the minimum 1P1E spacing G0 are all indicated by double arrows, and the nearby patterns having respective edges within the 3G0 distance of the target are included in the groups assigned by the method described herein.

Each group is associated with a cost pair, Gcost-1 and Gcost-2. The two costs correspond to the two legal colorings, where one coloring assigns each pattern to the opposite of the mask to which it is assigned in the other coloring. For example, in FIG. 3, group 310 has three circuit patterns 301-303. According to the first set of colorings, patterns 301 and 303 are assigned to the same photomask as the target 300, and pattern 302 is assigned to a different photomask. According to the second set of colorings, pattern 302 is assigned to the same photomask as the target pattern 300, and patterns 301 and 303 are assigned to a different photomask from the target 300. Although both of these sets of colorings are valid, they have different misalignment costs.

Because the misalignment only affects the spacings between the target pattern (or network) and patterns that are assigned to a different photomask, the cost computation is only performed with respect to the patterns assigned to the different photomask from the target. Each of these patterns has a baseline spacing from the target (for perfect alignment) and a corner spacing from the target for the maximum misalignment. Each pattern has a parasitic coupling that has a corner deviation (from the value computed during RC extraction) as a result of the corner misalignment.

For purpose of mask assignment, it is not necessary to perform an exact parasitic coupling computation using the same algorithm as the RC extraction tool. For enhanced execution speed, the computation takes into account the factors which have the greatest impact on the change in parasitic coupling due to misalignment.

In some embodiment, the calculated expected RC extraction error cost for each one of the groups is based at least partially on a length of each pair of parallel edges including an edge in the target circuit pattern or network of circuit patterns and an edge in one of the circuit patterns within the one group for which the cost is being computed. In some embodiments, the calculated expected RC extraction error cost for each one of the groups is based at least a partially on a spacing between each pair of parallel edges including an edge in the circuit pattern or network of circuit patterns and an edge in one of the circuit patterns within the one group.

For example, in some embodiments, the calculated expected RC extraction error cost for each one of the groups is based on:
  a length of each pair of parallel edges including an edge in the circuit pattern or network of circuit patterns and an edge in one of the circuit patterns within the one group;
  a spacing between each pair of parallel edges; and
  a maximum expected mask alignment error.

The two costs in each cost pair are computed by the summation of all the costs associated with polygons that are assigned to the different photomask from the target. If two polygons are distributed on opposite sides of the target polygon, their costs are offset against each other, resulting in partial or full compensation.

In some embodiments, the effect of complex circuit pattern shapes and spatial relationships are taken into account, by segmenting the patterns for purpose of the cost computation. For example, in FIG. 3, the parallel segments E1-E16 of the edges are considered. The parallel edges are segmented, and the cost associated with each pair of coextensive parallel segments is considered. In some embodiments, the portion of a pattern extending beyond a parallel pattern is not considered. For example, patterns 300 and 304 have parallel vertical edges, but only the coextensive portions E1 and E9 having the same beginning Y-coordinate and ending Y-coordinate are considered.

Also, if two patterns are partially separated by an intervening pattern, only the unobstructed segments which directly face each other are considered. For example, pattern 300 has couplings with each of the patterns 301, 302 and 303. However, only the directly facing (unobstructed) segment pairs (E2 and E13, E3 and E11, E4 and E10, E5 and E12, E6 and E14) are considered.

Figure 5:
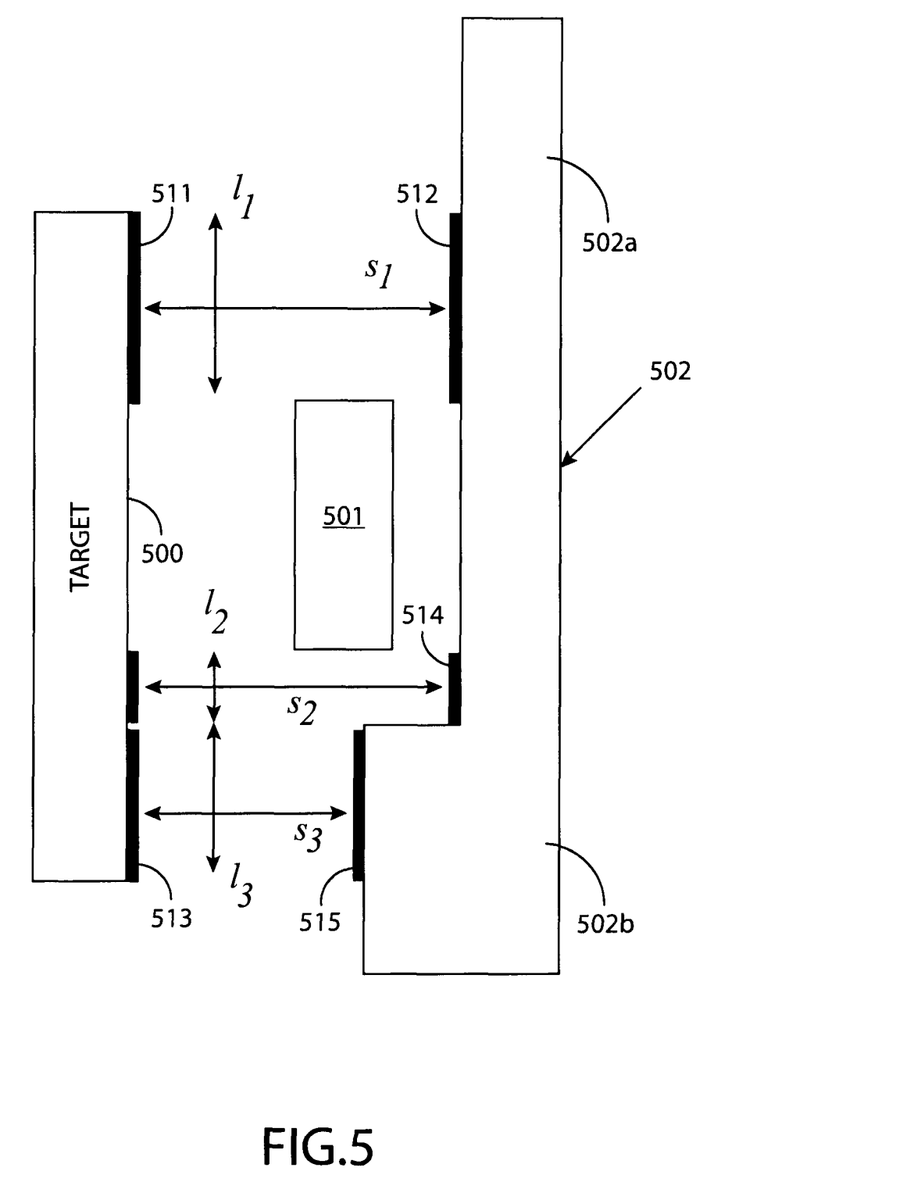

As another example, as shown in FIG. 5, the circuit pattern 502 is represented by a polygon having two portions 502a and 502b of different widths and having different distances from the target polygon 500. For speed of computation, the parallel segments 511-515 which are coextensive are considered. This includes segments 511 and 512 above pattern 501 separated by spacing S1, segments 513 and 514 below pattern 501 separated by spacing S2, and segments 513 and 515 separated by spacing S3. Pattern 501 is formed by the same mask as the target pattern, and has zero change in parasitic capacitance due to misalignment error. Thus, it is unnecessary to consider the segments alongside pattern 501.

In some embodiments, a polygon's cost is defined as being in proportion to the length of the parallel segments of the edges of each pair of capacitively coupled patterns. In some embodiments, a polygon's cost is defined as being inversely proportional to the space between the parallel segments of the edges of each pair of capacitively coupled patterns. In some embodiments, a polygon's cost is defined as being in proportion to a ratio of the length of the parallel segments of the edges of each pair of capacitively coupled patterns to the space between that pair of parallel segments of the edges. In some embodiments, a polygon's cost is defined as follows by its segmented parallel length (l) and parallel spacing(s) to the target polygon.

$$\text{Cost}=\Sigma li \cdot (1/si - 1/(si+\Delta\text{shift})). \quad (1)$$

where i is an integer, $l_i$ is the length of parallel segments of the edges of each pattern, $s_i$ is the spacing between the pair of parallel segments of edges, and $\Delta$shift is the maximum expected mask alignment error between photomasks.

On a group basis, the magnitude of the expected RC extraction error cost for one of the groups is calculated by:

$$|\text{Cost}|=\Sigma l_i*[1/s_i - 1/(s_i+\Delta\text{shift})]; \text{ and}$$

the expected RC extraction error cost of each group is given by:

$$\text{Cost}=\text{sign}*|\text{Cost}|,$$

where sign=+1 for each group on a first side of the selected circuit pattern or network, and sign=−1 for each group on a second side of the selected circuit pattern or network opposite the first side.

FIG. 5 shows an example of cost computation of the right-most polygon for x-direction shift. The cost function reflects the coupling capacitance change behavior—and is proportional to the parallel lengths and inversely proportional to spacings between parallel segments.

Continuing the cost calculation of step 206, a pair of costs Gcost-1 and Gcost-2 is computed for each group. Referring again to FIG. 4, to compute Gcost-1 and Gcost-2, assume that the respective costs for individual patterns 1-6 for an x-direction shift based on equation (1) are 60, 70, 0, 50, 75, and 35.

For the group 401 including pattern 1, the cost computations (CC#1), cost pair is (60, 0), meaning that the cost is 60, if pattern 1 is in a different mask from the target, and zero if pattern 1 is assigned to the same mask as the target. CC#1 is associated with the left groups (groups located to the left of the target). Although both of these sets of colorings are valid, they have different misalignment costs.

The group 402 including patterns 2-4 have their mask assignments automatically determined by the mask assignment of the target pattern, because adjacent ones of the target pattern and patterns 2-4 are separated from each other by sub-G0 distances. Patterns 2 and 4 are assigned to the different mask from the target, and pattern 3 is assigned to the same mask as the target. Furthermore, because polygon 2 and polygon 4 are on opposite sides of the target polygon, their costs are offset against each other, and partially compensate for each other. Thus, the cost pair of CC#2 is (70-50, 70-50)=(20, 20) and it is located to the left the target, because the larger parasitic coupling is between the target and polygon 2 on the left. Because the mask assignments of patterns 2-4 are automatically determined by the target pattern assignment, there is only one legal cost value, even though the target pattern can be assigned to either of the masks.

For group 403, the cost pair is (75, 35) based on a cost of 75 if polygon 5 has a different color from the target pattern while polygon 6 has the same color, and a cost of 35 for the coloring swap (polygon 6 has a different color from the target pattern while polygon 5 has the same color). Group 403 is on the right side of the target, and its cost computation is CC#3. Although both of these sets of colorings are valid, they have different misalignment costs.

Referring again to FIG. 2, at step 208, the circuit patterns in the one or more groups are assigned to be patterned by respective photomasks, so as to minimize a total of the expected RC extraction error costs. In this step, coloring groups are colored (assigned to masks) to balance the total cost of left groups and right groups. In some embodiments, this includes three steps. In the first step, for each coloring group, the smaller cost of its cost pair is selected as its basic shift cost, $b_i$; and the gap between the smaller cost and the larger cost is its color-swapping weight, $w_i$. For example, continuing with the example of FIG. 4, the basic three coloring groups, $b_i$ are 0 for group 401, 20 for group 402, and 35 for group 403. The $w_i$, are 60 for group 401, 0 for group 402, and 40 for group 403, respectively. In the second step, a pair of 0-1 knapsack problems are formulated as follows by viewing each coloring group as an "item" to solve the total cost balance problem.

Problem 1:

Given n items. Let $+w_i$ denote both the value and weight of item i that belong to the items on the left of the target. Let denote both the value and weight of item j that belongs to items on the right of the target. Suppose a bag can hold up to weight Wmax=$\Sigma(-b_i)+\Sigma(+b_j)$. Which items should be put into the bag to maximize the sum of values of the items in the bag?

For the example of FIG. 4, in Problem 1, Wmax=15; selected groups: none; final value=0.

Problem 2:

Given n items. Let $-w_i$ denote both the value and weight of item i that belongs to items on the left of the target. Let $+w_j$ denote both the value and weight of item j that belongs to items on the right of the target. Suppose a bag can hold up to weight $W_{max}=\Sigma(+b_i)+\Sigma(-b_j)$. Which items should be put into the bag to maximize the sum of values of the items in the bag?

For the example of FIG. 4, in Problem 2: Wmax=−15; selected items: #1 and #3; final value=−20

Solutions of the above two 0-1 knapsack problems correspond to the two most balanced solutions: one solution has larger left-group cost and the other one has a larger right-group cost. Thus, in the third step, the coloring scheme which is more balanced is selected as the resulting coloring scheme.

Figure 6:
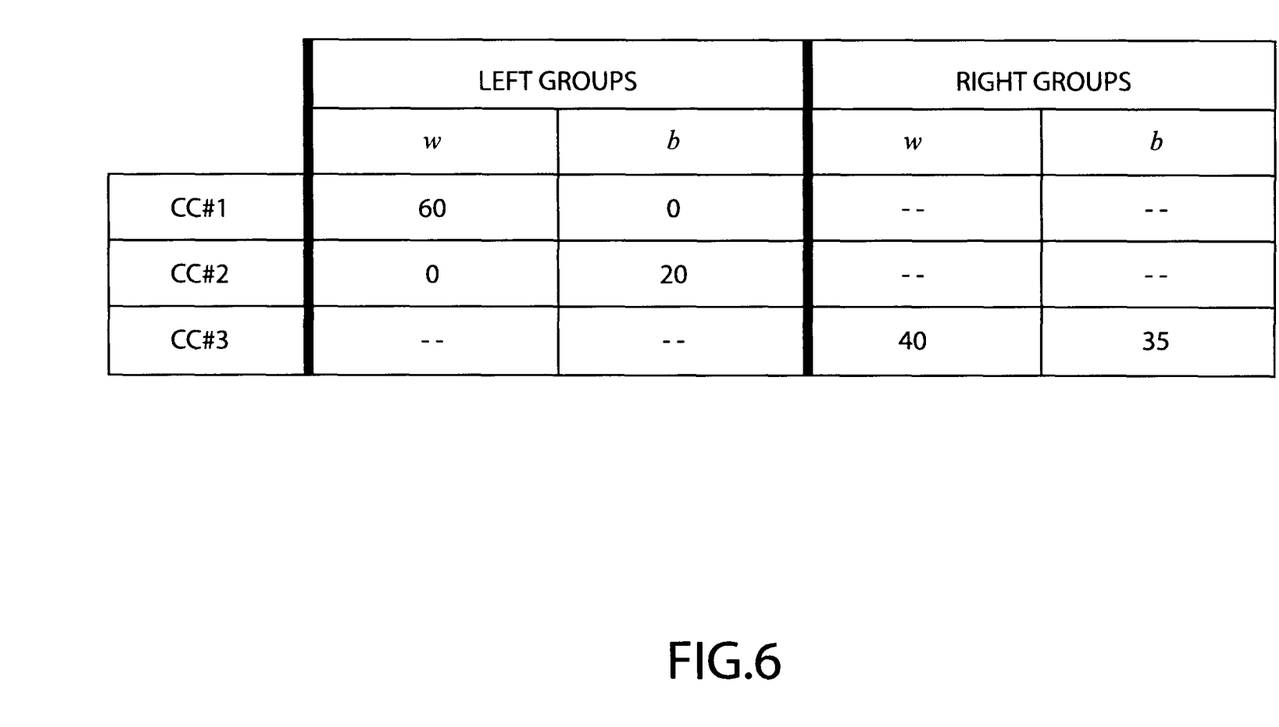
FIG. 6 is a table of misalignment costs for the example of FIG. 4.

FIG. 6 is a table summarizing the two solutions and the final result.

Thus, the final result for the example of FIG. 4 is that groups: 401 and 403 are selected (i.e., CC#1 and CC#3 use coloring assignment with larger cost). The mask assignments are:

mask 1: patterns 1, 2, 3, and 5
mask 2: target, and patterns 4 and 6

In this example, because a group is considered to be nearby (to the target) only when it is within three times the minimum 1P1E spacing, which is about (32*3)=96 nm, the number of nearby groups of a net is expected to be small. Therefore, the 0-1 knapsack problems can be easily solved.

The resulting assignments provide a color balanced set of mask assignments that has the closest cost value to the unshifted (i.e., perfectly aligned) GDS. In other words, the actual total parasitic capacitances in the mask misalignment corner case will have minimal deviation from the parasitic capacitances in the perfectly aligned case. Although individual parasitic couplings vary due to mask misalignment, using the present method, the deviations of the parasitic couplings on the left and right sides of the target pattern compensate for each other throughout the range of likely mask misalignments.

Pseudocode is provided below for one example of an implementation, which can be executed by a general purpose processor programmed with computer software code. In this example, the patterns (polygons) are categorized as being fixed or flexible polygons. The fixed polygons either have fixed mask assignments because they are connected by subminimum 1P1E spacings to the target pattern (e.g., patterns 2-4 in FIG. 4), or because the designer has already assigned them to a specific mask. Flexible polygons have not yet been assigned to a specific mask, are separated from the target pattern by at least the minimum 1P1E spacing, and can be assigned in the manner described herein. Thus, polygons and groups having no sub-minimum 1P1E spacing connection to the target pattern are flexible. The fixed polygons are also categorized into same and different categories, where the fixed-same category is already assigned to the same mask as the target (e.g., pattern 3 in FIG. 4), and the fixed-different category is already assigned to a different mask from the target (e.g., patterns 2 and 4 in FIG. 4). Lastly, the polygons are categorized into right and left polygons, based on the spatial relationship to the target pattern.

This embodiment focuses on assignment of the right and left flexible polygons, since the assignment of right and left fixed polygons is either previously determined, or is dictated by sub-minimum 1P1E spacing connections between the target polygon and a given pattern or group of patterns.

In the main procedure, a right-minus-left cost is computed as the sum of the costs for the fixed polygons on the right side of the target assigned to a different mask from the target, minus the sum of the costs for the fixed polygons on the left side of the target assigned to the different mask from the target. The initial color cost of the target net is thus defined by fixed mask assignments for polygons within the sub-minimum 1P1E spacing. If right-minus-left cost is positive, the right flexible polygons are assigned to the same mask as the target and the color procedure is executed to assign the left flexible polygons. If right-minus-left cost is zero or negative, left flexible polygons are assigned to the same mask as the target and the color procedure is executed to assign the right flexible polygons.

```
// Main Procedure
INPUT: Polygons with local environment analysis
OUTPUT: Polygons with mask assignment
R_minus_L_Cost:=sum(Right-Fix-Diff)-sum(Left-Fix-Diff)
If(R_minus_L_Cost>0)
  all Right-Flex Polygons:=SAME_MASK
  Color {Left-Flex Polygons, R_minus_L_Cost}
Else
  all Left-Flex Polygons:=SAME_MASK
  Color {Right-Flex Polygons, -R_minus_L_Cost}
Return all Polygons
```

The Color procedure begins using, as an input cost, the right-minus-left cost to assign the left flex polygons, or −1* right-minus-left cost to assign the right flexible polygons. The largest flexible polygon to be assigned, which is smaller than the input cost, is selected, assigned to the different mask from the target, and is subtracted from the input cost to compensate for the polygons on the opposite side. This selection is repeated, subtracting, from the revised input cost, the largest remaining unassigned flexible polygon smaller than the revised input cost. The repetition continues until there is no remaining flexible polygon to be assigned, which is smaller than the currently revised value of the input cost.

```
// Color Procedure
INPUT: Polygons, InputCost
OUTPUT: Polygons with mask assignment
While(true){
    compensate:=max(Un-masked Polygon with
Cost<=InputCost)
    if(Polygon found)
    Selected Polygon:=DIFF_MASK
    InputCost:=InputCost-compensate
    else
    break
}
Un-masked Polygons:=SAME_MASK
Return all Polygons
```

Figure 7:
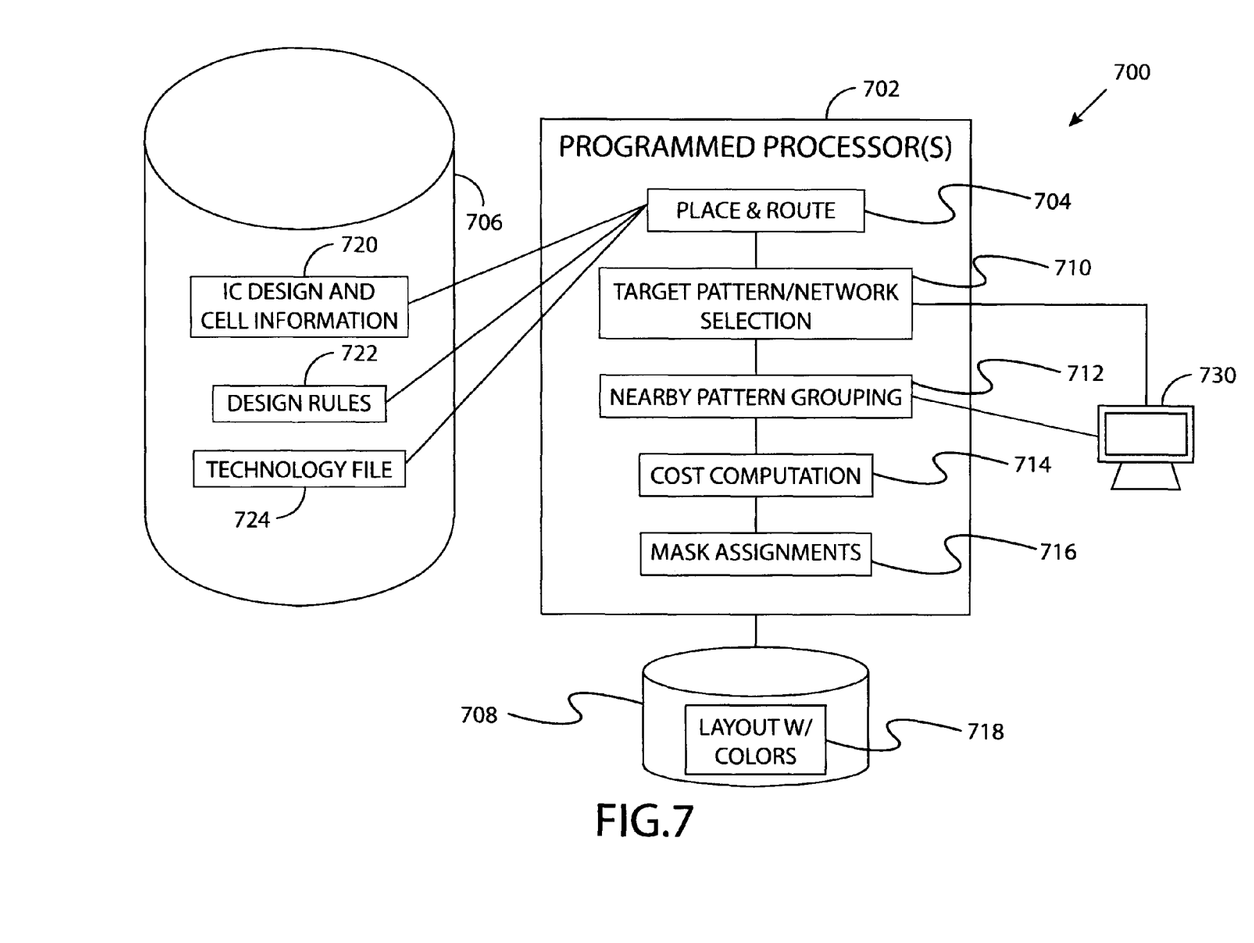
FIG. 7 is a block diagram of a programmed computer implementation of a tool for performing the method of FIG. 2.

FIG. 7 is a block diagram of a system 700 for optimizing mask assignments, according to one embodiment. Block 702 indicates that one or more programmed processors may be included. In some embodiments, the processing load is performed by two or more application programs, each operating on a separate processor. In other embodiments, the processes are all performed using one processor. Similarly, two media 706 and 708 are shown, but the data may be stored in any number of media. Although FIG. 7 shows an allocation of the various tasks to specific modules, this is only one example. The various tasks may be assigned to different modules to improve performance, or improve the ease of programming.

System 700 includes an electronic design automation ("EDA") tool such as "IC COMPILER"™, sold by Synopsys, Inc. of Mountain View, Calif., which may include a place and route tool 704, such as "ZROUTE"™, also sold by Synopsys. Other EDA tools 702 may be used, such as the "VIRTUOSO" custom design platform or the Cadence "ENCOUNTER"® digital IC design platform may be used, along with the "VIRTUOSO" chip assembly router 704, all sold by Cadence Design Systems, Inc. of San Jose, Calif.

The EDA tool is a special purpose computer formed by retrieving stored program instructions from a non-transient computer readable storage medium 706 and executing the instructions on a general purpose processor 702. Thus, the instructions configure the logic circuits of the processor 702 to function as an EDA tool. Examples of non-transient computer readable storage mediums 706, 708 include, but are not limited to, hard disk drives (HDD), read only memories ("ROMs"), random access memories ("RAMs"), flash memories, or the like. Tangible, non-transient machine readable storage mediums 706, 708 are configured to store data generated by the place and route tool 704.

The router of the place and route tool 704 is capable of receiving an identification of a plurality of cells to be included in an integrated circuit ("IC") or interposer layout, including a netlist 720 containing pairs of cells within the plurality of cells to be connected to each other. Router 704 may be equipped with a set of default design rules 722 and tech file 724.

A module 710 performs the target pattern or network selection. In some embodiments, module 710 causes a layer of the IC to be displayed on the display device 730 The module permits the user to zoom in on a smaller region within the layer. The module 710 prompts the user to select a region containing a network (e.g., a timing critical network), using a pointing device, for example. The user's selection is then stored in the medium 706. In other embodiments, the user provides a list of the timing critical networks in the storage medium 706. The target pattern or network selection module retrieves these previously identified networks as discussed with reference to FIG. 2.

A nearby pattern grouping module 712 displays all patterns having an edge within a predetermined distance (e.g., three times the minimum 1P1E spacing) of the selected target pattern. In some embodiments, all sub-minimum 1P1E spacings are identified by a highlight, distinctive connecting arrow, or the like. The module 712 prompts the user to group one or more subsets of the displayed patterns using a pointing device, for example. The user can select the patterns and use a pop-up menu to group (or ungroup) patterns.

A cost computation module 714 identifies the (as yet) unassigned "flexible" patterns (at least the minimum 1P1E spacing from the target), and computes the costs of mask misalignment for both sets of mask assignments, as described above with reference to step 206 and/or the pseudo code described above.

A mask assignment module 716 performs the selection and mask assignments in order to balance the cost of mask misalignment on right and left sides (or top and bottom sides) of the target, as described above with reference to step 208 and the pseudo code described above.

The layout with mask assignments (colors) 718 is then stored in a non-transitory machine-readable storage medium 708.

In some embodiments, the method further comprises storing information representing the respective mask assignments of the circuit pattern or network of circuit patterns and the groups of circuit patterns of a non-transitory, machine readable storage medium to be read by a process for forming a set of photomasks used for fabricating the IC.

In some embodiments, a method comprises: selecting a circuit pattern or network of circuit patterns in a layout of an integrated circuit (IC) to be fabricating using double patterning technology (DPT); grouping circuit patterns near the selected circuit pattern or network into one or more groups; for each group, calculating a respective expected resistance-capacitance (RC) extraction error cost associated with a mask alignment error, for two different sets of mask assignments; and assigning the circuit patterns in the one or more groups to be patterned by respective photomasks, so as to minimize a total of the expected RC extraction error costs.

In some embodiments, a non-transitory, computer readable storage medium is encoded with computer program instructions, such that when the computer program instructions are executed by a computer, the computer performs a method comprising: selecting a circuit pattern or network of circuit patterns in a layout of an integrated circuit (IC) to be fabricating using double patterning technology (DPT); grouping circuit patterns near the selected circuit pattern or network into one or more groups; for each group, calculating a respective expected resistance-capacitance (RC) extraction error cost associated with a mask alignment error, for two different sets of mask assignments; and assigning the circuit patterns in the one or more groups to be patterned by respective photomasks, so as to minimize a total of the expected RC extraction error costs.

In some embodiments, a system comprises a non-transitory, computer readable storage medium encoded with data representing a set of circuit patterns of a layout to be formed on a layer of a semiconductor substrate using double patterning technology (DPT). A computer is programmed to perform a method comprising: selecting a circuit pattern or network of circuit patterns from the set of circuit patterns; grouping other circuit patterns from the set of circuit patterns, which are near the selected circuit pattern or network, into one or more groups; for each group, calculating a respective expected resistance-capacitance (RC) extraction error cost associated with a mask alignment error, for two different sets of mask assignments; and assigning the circuit patterns in the one or more groups to be patterned by respective photomasks, so as to minimize a total of the expected RC extraction error costs.

Although the subject matter has been described in terms of exemplary embodiments, it is not limited thereto. Rather, the appended claims should be construed broadly, to include other variants and embodiments, which may be made by those skilled in the art.

What is claimed is:

1. A method comprising:

selecting a circuit pattern or network of circuit patterns in a layout of an integrated circuit (IC) to be fabricating using double patterning technology (DPT);

grouping circuit patterns near the selected circuit pattern or network into one or more groups, such that adjacent circuit patterns within each group are separated from each other by less than a predetermined distance, and the circuit patterns within each group are separated from the selected circuit pattern by a distance greater than the predetermined distance and not more than three times the predetermined distance;

for each group, using a computer to calculate a respective expected increase in parasitic resistance-capacitance (RC) coupling associated with a predetermined mask alignment error, for two different sets of mask assignments, based on a difference between a ratio of coextensive length over spacing between the selected circuit pattern and each circuit pattern in the group in the absence of a mask alignment error, and on the ratio of coextensive length over spacing between the selected circuit pattern and each circuit pattern in the group in the presence of the predetermined mask alignment error; and assigning the circuit patterns in the one or more groups to be patterned by respective photomasks, so as to minimize a total of the expected increase in parasitic RC coupling.

2. The method of claim 1, wherein the predetermined mask alignment error is a maximum expected mask alignment error.

3. The method of claim 2, wherein a magnitude of the expected increase in parasitic RC coupling for one of the groups is calculated by:

$$|\text{Cost}|=\Sigma l_i*[1/s_i-1/(s_i+\Delta\text{shift})]$$

where i is an integer, $l_i$ is the length of the $i^{th}$ pair of parallel edges, $s_i$ is the spacing between the $i^{th}$ pair of parallel edges, and $\Delta$shift is the maximum expected mask alignment error.

4. The method of claim 3, wherein the expected increase in parasitic RC coupling of each group is given by:

$$\text{Cost}=\text{sign}*|\text{Cost}|,$$

where sign=+1 for each group on a first side of the selected circuit pattern or network, and sign=−1 for each group on a second side of the selected circuit pattern or network opposite the first side.

5. The method of claim 1, further comprising ordering the groups by timing criticality, wherein the calculating and assigning steps are performed for each group in order of the respective timing criticality of each group.

6. The method of claim 1, wherein the grouping step comprises including circuit patterns in one of the groups near the selected circuit pattern if the circuit patterns are within three times a minimum separation spacing between two circuit patterns to be formed within a single layer of the IC by a single photomask.

7. The method of claim 1, further comprising storing information representing the respective mask assignments of the circuit pattern or network of circuit patterns and the groups of circuit patterns of a non-transitory, machine readable storage medium to be read by a process for forming a set of photomasks used for fabricating the IC.

8. A non-transitory, computer readable storage medium encoded with computer program instructions, such that when the computer program instructions are executed by a computer, the computer performs a method comprising:

selecting a circuit pattern or network of circuit patterns in a layout of an integrated circuit (IC) to be fabricating using double patterning technology (DPT);

grouping circuit patterns near the selected circuit pattern or network into one or more groups, such that adjacent circuit patterns within each group are separated from each other by less than a predetermined distance, and the circuit patterns within each group are separated from the selected circuit pattern by a distance greater than the predetermined distance and not more than three times the predetermined distance;

for each group, calculating a respective expected increase in parasitic resistance-capacitance (RC) coupling associated with a predetermined mask alignment error, for two different sets of mask assignments, based on a difference between a ratio of coextensive length over spacing between the selected circuit pattern and each circuit pattern in the group in the absence of a mask alignment error, and on the ratio of coextensive length over spacing between the selected circuit pattern and each circuit pattern in the group in the presence of the predetermined mask alignment error; and assigning the circuit patterns in the one or more groups to be patterned by respective photomasks, so as to minimize a total of the expected increase in parasitic RC coupling.

9. The non-transitory, computer readable storage medium of claim 8, wherein the predetermined mask alignment error is a maximum expected mask alignment error.

10. The non-transitory, computer readable storage medium of claim 9, wherein the expected increase in parasitic RC coupling for one of the groups is calculated by:

$$\text{Cost}=\text{sign}*\Sigma l_i*[1/s_i-1/(s_i+\Delta\text{shift})]$$

where i is an integer, $l_i$ is the length of the $i^{th}$ pair of parallel edges, $s_i$ is the spacing between the $i^{th}$ pair of parallel edges, $\Delta$shift is the maximum expected mask alignment error, sign=+1 for each group on a first side of the selected circuit pattern or network, and sign=−1 for each group on a second side of the selected circuit pattern or network opposite the first side.

11. The non-transitory, computer readable storage medium of claim 8, further comprising ordering the groups by timing criticality, wherein the calculating and assigning steps are performed for each group in order of the respective timing criticality of each group.

12. The non-transitory, computer readable storage medium of claim 8, wherein the grouping step comprises including circuit patterns in one of the groups near the selected circuit pattern if the circuit patterns are within three times a minimum separation spacing between two circuit patterns to be formed within a single layer of the IC by a single photomask.

13. A system comprising:

a non-transitory, computer readable storage medium encoded with data representing a set of circuit patterns of a layout to be formed on a layer of a semiconductor substrate using double patterning technology (DPT); and a computer programmed to perform a method comprising:
   selecting a circuit pattern or network of circuit patterns from the set of circuit patterns;
   grouping other circuit patterns from the set of circuit patterns, which are near the selected circuit pattern or network, into one or more groups, such that adjacent circuit patterns within each group are separated from each other by less than a predetermined distance, and the circuit patterns within each group are separated from the selected circuit pattern by a distance greater than the predetermined distance and not more than three times the predetermined distance;
   for each group, calculating a respective expected increase in parasitic resistance-capacitance (RC) coupling associated with a predetermined mask alignment error, for two different sets of mask assignments, based on a difference between a ratio of coextensive length over spacing between the selected circuit pattern and each circuit pattern in the group in the absence of a mask alignment error, and on the ratio of coextensive length over spacing between the selected circuit pattern and each circuit pattern in the group in the presence of the predetermined mask alignment error; and
   assigning the circuit patterns in the one or more groups to be patterned by respective photomasks, so as to minimize a total of the expected increase in parasitic RC coupling.

14. The system of claim 13, wherein the predetermined mask alignment error is a maximum expected mask alignment error.

15. The system of claim 14, wherein the expected increase in parasitic RC coupling for one of the groups is calculated by:

$$\text{Cost}=\text{sign}*\Sigma l_i*[1/s_i-1/(s_i+\Delta\text{shift})]$$

where i is an integer, $l_i$ is the length of the $i^{th}$ pair of parallel edges, $s_i$ is the spacing between the $i^{th}$ pair of parallel edges, $\Delta$shift is the predetermined maximum expected mask alignment error, sign=+1 for each group on a first side of the selected circuit pattern or network, and sign=−1 for each group on a second side of the selected circuit pattern or network opposite the first side.

16. The system of claim 13, further comprising ordering the groups by timing criticality, wherein the calculating and assigning steps are performed for each group in order of the respective timing criticality of each group.

17. The system of claim 13, wherein the grouping step comprises including circuit patterns in one of the groups near the selected circuit pattern if the circuit patterns are within three times a minimum separation spacing between two circuit patterns to be formed within a single layer of the IC by a single photomask.

18. A method comprising:
   selecting a circuit pattern or network of circuit patterns in a layout of an integrated circuit (IC) to be fabricating using double patterning technology (DPT);
   grouping circuit patterns near the selected circuit pattern or network into one or more groups,
   for each group, using a computer to calculate a respective expected increase in parasitic resistance-capacitance (RC) coupling associated with a predetermined mask alignment error, for two different sets of mask assignments, based on a difference between a ratio of coextensive length over spacing between the selected circuit pattern and each circuit pattern in the group in the absence of a mask alignment error and on the ratio of coextensive length over spacing between the selected circuit pattern and each circuit pattern in the group in the presence of the predetermined mask alignment error;
   dividing the groups into a first set of groups on the right side of the selected circuit pattern and a second set of groups on the left side of the selected circuit pattern;
   summing the expected increases in parasitic RC couplings for the first set of groups to provide a first sum;
   summing the expected increases in parasitic RC couplings for the second set of groups to provide a second sum; and
   assigning the circuit patterns in the one or more groups to be patterned by respective photomasks, so as to minimize a total of the expected increase in parasitic RC coupling, including:
      if the first sum minus the second sum is positive, assigning the patterns in the first set of groups to the same mask as the selected circuit pattern; and
      if the first sum minus the second sum is negative, assigning the patterns in the second set of groups to the same mask as the selected circuit pattern.

19. The method of claim 18, wherein adjacent circuit patterns within each group are separated from each other by less than the predetermined distance.

20. The method of claim 19, wherein the circuit patterns within each group are separated from the selected circuit pattern by a distance greater than the predetermined distance and not more than three times the predetermined distance.

* * * * *

UNITED STATES PATENT AND TRADEMARK OFFICE
CERTIFICATE OF CORRECTION

PATENT NO. : 8,732,628 B1
APPLICATION NO. : 13/742689
DATED : May 20, 2014
INVENTOR(S) : Meng-Fan Wu et al.

Page 1 of 1

It is certified that error appears in the above-identified patent and that said Letters Patent is hereby corrected as shown below:

In the Claims

Claim 18, Column 14, Line 21 – delete the word "error" and insert -- error, --.

Signed and Sealed this
Seventeenth Day of February, 2015

Michelle K. Lee
*Deputy Director of the United States Patent and Trademark Office*